United States Patent [19]

Maida

[11] Patent Number: 5,475,339
[45] Date of Patent: Dec. 12, 1995

[54] OP AMP WITH RAIL TO RAIL OUTPUT SWING AND EMPLOYING AN IMPROVED CURRENT MIRROR CIRCUIT

[75] Inventor: Michael X. Maida, San Jose, Calif.

[73] Assignee: National Semiconductor Corporation, Santa Clara, Calif.

[21] Appl. No.: 239,032

[22] Filed: May 6, 1994

[51] Int. Cl.$^6$ .................................................. G06G 7/42
[52] U.S. Cl. ........................ 327/561; 330/252; 330/257
[58] Field of Search .............................. 327/52, 89, 108, 327/127, 229, 246, 266, 274, 280, 287, 530, 538, 535, 561, 563; 330/252, 253, 255, 257, 261

[56] References Cited

U.S. PATENT DOCUMENTS

| | | | |
|---|---|---|---|
| 3,571,694 | 3/1971 | Hunger | 327/538 |
| 4,068,182 | 1/1978 | Dingwall et al. | 330/261 |
| 5,327,100 | 7/1994 | Stockstad et al. | 330/255 |
| 5,361,040 | 11/1994 | Barrett, Jr. | 330/257 |

Primary Examiner—Timothy P. Callahan
Assistant Examiner—Jeffrey Zweizig
Attorney, Agent, or Firm—Limbach & Limbach

[57] ABSTRACT

An op amp circuit utilizes an improved current mirror circuit that includes a first transistor connected to a second transistor such that their sources and gates are commonly connected. A resistive element is connected between the drain and the gate of the first transistor such that a current passing through the second transistor is proportionally related to the current passing through the first transistor and the drain to source voltage of the first transistor accurately tracks the drain to source voltage of the second transistor. The resistive element may be a resistor or a third diode connected transistor. Additional transistors may be added in cascode configuration as needed. The op amp includes an input stage for receiving the differential input and for outputing a modified differential output that is proportional to the differential input.

1 Claim, 3 Drawing Sheets 5,475,339

OP AMP WITH RAIL TO RAIL OUTPUT SWING AND EMPLOYING AN IMPROVED CURRENT MIRROR CIRCUIT

FIELD OF THE INVENTION

The present invention relates to a highly stable operational amplifier circuit using an improved current mirror to drive a capacitive load.

BACKGROUND OF THE INVENTION

A conventional current mirror circuit using MOS transistors is shown in FIG. 1. The circuit operates from a $V_{DD}$ power supply with its positive terminal connected to terminal 10 and its negative terminal connected to ground terminal 11. An input current $I_{IN}$ passing through p-channel transistor 14 and to terminal 12 is reflected as $I_{OUT}$ flowing as an output current through p-channel transistor 15 and to terminal 13. Transistor 14 is diode-connected with its gate connected to its drain. The gate of transistor 14 is connected to the gate of transistor 15. With such a configuration, transistor 14 develops a threshold voltage drop, $V_T$, which is applied to the gate of transistor 15 thereby causing it to conduct $I_{OUT}$. If the two transistors are matched, then $I_{OUT}$ equals $I_{IN}$. By varying device parameters, the transistors can produce either a current gain or loss. Typically, the transistors are fabricated to have the same channel length, while the channel widths are varied to provide channels having different areas and thereby passing different currents. Thus, the channel width is a design factor in circuit performance. While FIG. 1 shows a single output transistor, a plurality of output transistors can be coupled to the input transistor so that a single input current can be mirrored as a plurality of related output currents. The various output transistors can then be sized to produce the required current values.

In addition, although FIG. 1 shows p-channel transistors sourcing currents, if desired, current sinks can be created using n-channel transistors connected in the same manner to complement the p-channel device configuration. Clearly, both polarities can be employed in CMOS structures.

Ideally, an operational amplifier (op amp) is a differential input, single-ended output voltage amplifier that provides infinite voltage gain with infinite input impedance and bandwidth and zero output impedance.

SUMMARY OF THE INVENTION

The present invention provides an improved current mirror circuit in which a first transistor is connected to a second transistor such that their sources and gates are commonly connected. A resistive element is connected between the drain and the gate of the first transistor such that a current passing through the second transistor is proportionally related to the current passing through the first transistor and the drain to source voltage of the first transistor approximately equals the drain to source voltage of the second transistor. The resistive element may be a resistor or a third transistor. Additional transistors may be added in cascode configuration as needed.

An advantage of the mirror circuit of the present invention is that the addition of the resistive element in the manner described makes it easier to track the drain to source voltage when the output transistor is operated at low current conditions while driving a large device.

The present invention also encompasses a novel op amp that utilizes the improved current mirror circuit. This op amp includes an input stage for receiving the differential input and for providing a modified differential output that is proportional to the differential input and a pair of current mirrors that receive the differential output and provide a differential drive current to a pair of output transistors that are connected to an output terminal.

An advantage of this op amp is its stability, which is an important factor when driving a capacitive load. This stability is due in part to the lack of internal high impedance nodes to cause phase shifts.

Another advantage is that the circuit can be operated in a rail to rail manner because of the configuration of the input stage and because the drop in the voltage in the output stage is small (on the order of 10 millivolts).

DETAILED DESCRIPTION OF THE PREFERRED EMBODIMENTS

Figure 2:
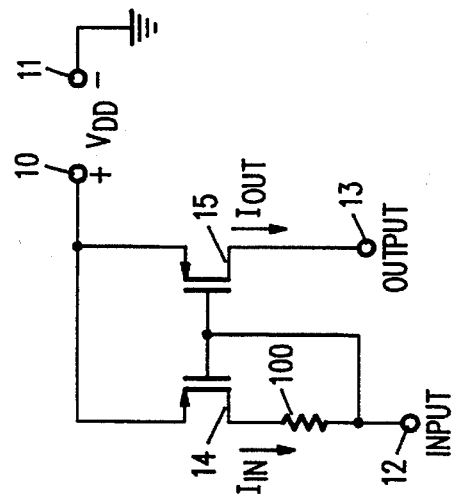
FIG. 2 is a schematic diagram illustrating an embodiment of an improved current mirror circuit according to the present invention.
Figure 1:
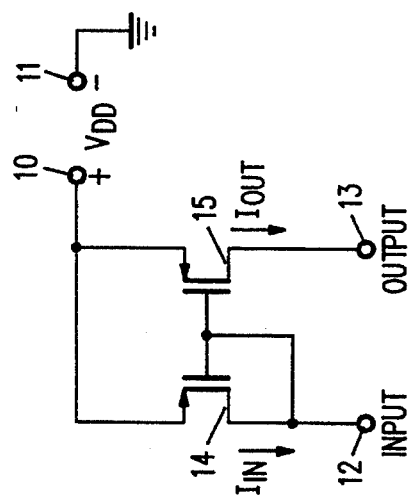
FIG. 1 is a schematic diagram illustrating a conventional current mirror circuit.

An improved current mirror circuit is illustrated in FIG. 2. Where the components are similar to those of FIG. 1, the same numerals are employed. A resistor 100 is connected in series with the drain of transistor 14. As a result, $I_{IN}$ will produce a voltage drop across resistor 100 so that the source to drain voltage is less than a threshold voltage, $V_T$.

Where the current mirror is employed to drive an output transistor gate (not shown), the source to drain potential across transistor 15 is operated at a threshold voltage, $V_T$.

When the output of transistor 15 is used to drive a large device at low current conditions, the circuit is subjected to the weak inversion fall-off of $I_{OUT}$. Thus, by using a resistive element such as resistor 100, this condition can be compensated for so that $V_{DS}$ (drain to source voltage) of transistor 14 more closely tracks $V_{DS}$ of transistor 15. More specifically, by inserting an element such as resistor 100, $V_{DS}$ of transistor 14 can be forced to a voltage that is smaller than a threshold voltage by an amount equal to $I_{IN} \times R_{100}$. If both transistor 14 and 15 are made to operate in weak inversion with equal values of $V_{DS}$ and equal current densities, the gain of the current mirror will be well-controlled.

Figure 4:
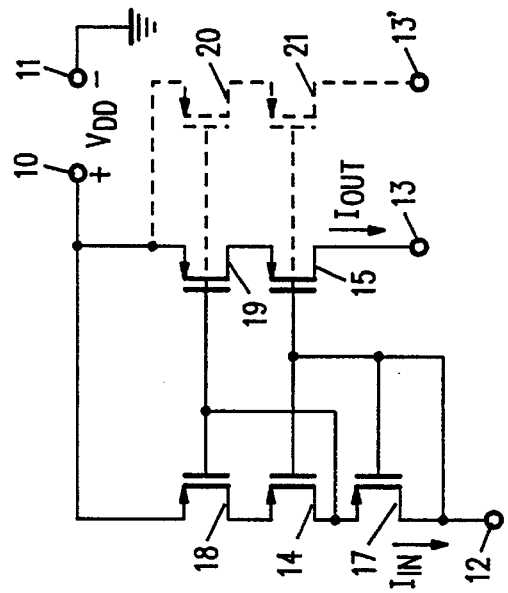
FIG. 4 is a schematic diagram illustrating a caseode configuration of the embodiment of FIG. 3.
Figure 3:
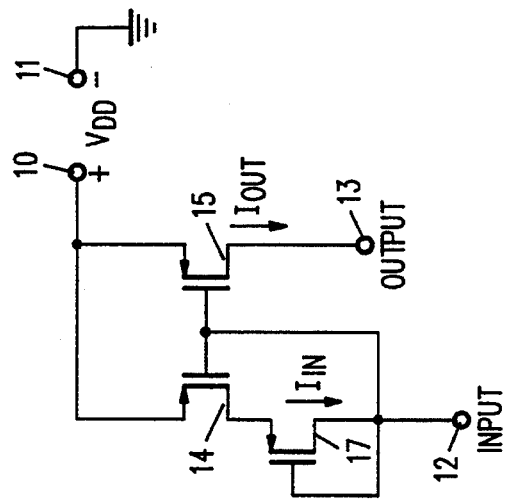
FIG. 3 is schematic diagram illustrating an alternative embodiment of the circuit of FIG. 2.

Since the effect is most pronounced at low operating currents, the value of resistor 100 will need to be relatively large (on the order of 4K ohms, for example). In order to conserve integrated circuit (IC) chip area, a field-effect transistor (FET) 17 may be employed in place of resistor 100, as shown in FIG. 3. FIG. 4 shows a cascode version of the circuit of FIG. 3. A p-channel transistor 18 is coupled between the source of transistor 14 and terminal 10. The gate of transistor 18 is directly connected to the gate of p-channel transistor 19, which is connected between the source of transistor 15 and terminal 10. The source of transistor 17 is connected to the gates of transistors 18 and 19. Therefore, the gate of transistor 18 will be biased at a potential $V_T$ below $+V_{DD}$ and the gates of transistors 14 and 15 will be biased at a potential 2 V, below $+V_{DD}$. Note that the gate voltage of transistor 17 serves to self-bias the gate of transistor 14 such that transistor 14 will operate in the resistive region. This circuit includes the benefits described with respect to the circuit shown in FIG. 2, and enjoys the further benefits associated with being cascode coupled.

Plural outputs can also be obtained with the cascode circuit, as shown by transistors 20 and 21 in the dashed outline. Transistors 20 and 21 are arranged in a fashion similar to transistors 19 and 15. Accordingly, another output current can be provided at output terminal 13'.

Figure 5:
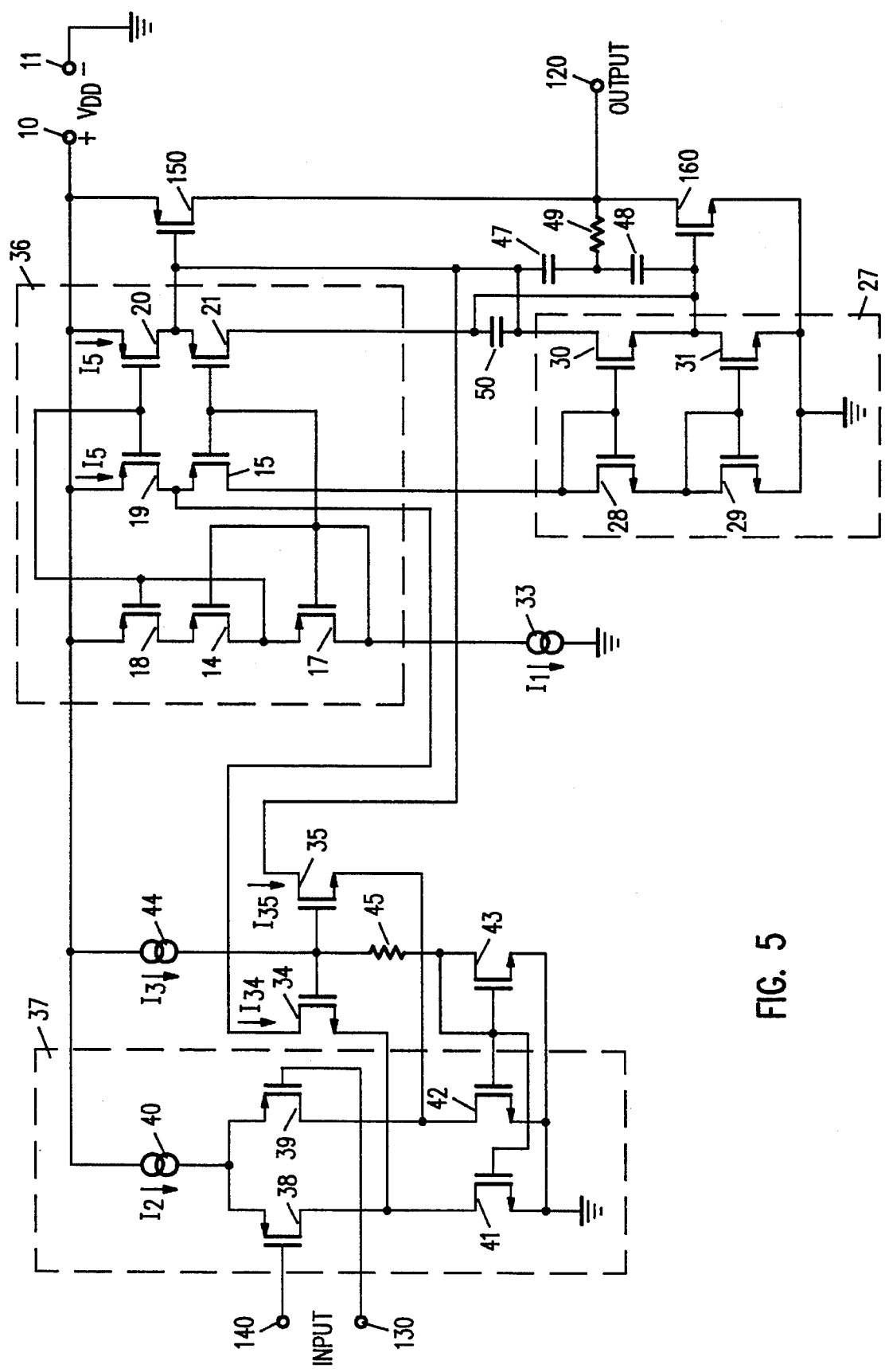
FIG. 5 is a schematic diagram illustrating a novel op amp according to the present invention.
Figure 6:
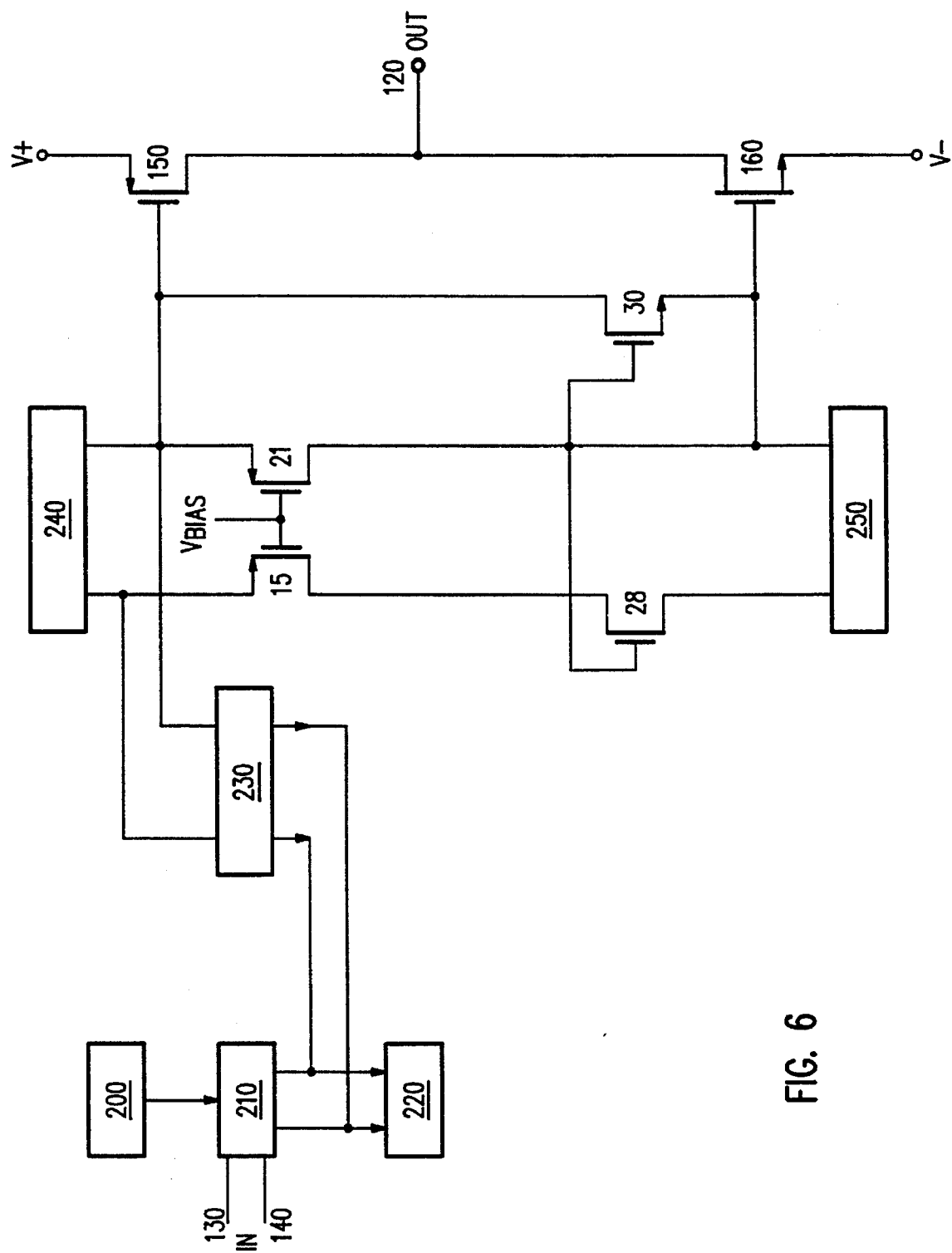
FIG. 6 is a simplified diagram of the schematic diagram of FIG. 5.

FIG. 5 is a schematic diagram of a novel op amp circuit. A more simplified form of FIG. 5 is shown in FIG. 6, which will be discussed later. In the preferred embodiment shown, the op amp employs the current mirror circuit: of FIG. 4.

The schematic of the op amp, as shown in FIG. 5, will now be described beginning at its input stage and proceeding to its output stage. The input stage 37 of the op amp includes depletion type p-channel transistors 38 and 39 which are configured as a differential pair operated by current source 40 which passes current $I_2$. Transistors 41 and 42 are operated as current sinks, and are biased at $I_2/2+I_{M34}$ and $I_2/2+I_{M35}$, respectively (where $I_{M34}$ is the current flowing through transistor 34 and $I_{M35}$ is the current flowing through transistor 35). Transistors 34 and 35 form a common-gate level shifting device referred to as a folded cascode stage. Transistor 43, operating at current $I_3$, is diode-connected to bias the gates of transistors 41 and 42. Resistor 45 is included to bias the gates of transistors 34 and 35 such that transistors 41 and 42 are operating in the saturation or constant current region.

Under quiescent conditions, the input terminals 130 and 140 will be at the same voltage. Consequently, transistors 38 and 39 both operate at $I_2/2$. Since transistors 41 and 42 operate at $I_2/2+I_{M34}$ and $I_2/2+I_{M35}$, respectively, transistors 34 and 35 will operate at $I_{M34}$ and $I_{35}$. In the event of a large input swing, such as that which occurs during slewing, it is important that neither of transistors 34 or 35 turns off. For example, if input terminal 140 is at a voltage far below the voltage at input terminal 130, transistor 38 will operate at $I_2$ and transistor 39 will be off. Under these conditions, for transistor 34 to be operating it must be true that the drain current of transistor 42 is greater than the absolute value of the drain current of transistor 38 (ie. $I_{M42}>ABS[I_{M38}]$). This requires that $I_{M34}$ and $I_{M35}$ both be greater than $I_2/2$. Therefore, transistors 41 and 42 normally operate at currents greater than $I_2$.

Transistors 38 and 39 are preferably depletion-type to enable operation with common-mode voltages anywhere between $V_{DD}$ and ground. When the inputs 130 and 140 are at $V_{DD}$, the transistors 38 and 39 operating in the depletion mode with their sources lower in potential than their gates. If the current source 40 is appropriately chosen, it will still output a current $I_2$ under the condition where its voltage drop is equal to the depletion threshold voltage ($V_{tdep}$) and the op amp will operate correctly.

When the inputs are at a ground voltage, there is a large voltage difference between the sources of transistors 38 and 39 and their bulk region, which is connected to $V_{DD}$. The body effect will alter the threshold voltage of transistors 38 and 39 such that they will now operate in the enhanced mode. Hence, transistors 38, 39, 41 and 42 can all be in the saturated region for input voltages at ground potential and the op amp will still operate correctly.

A differential input voltage applied between the input terminals will cause a differential drain current between transistors 38 and 39. Since the folded-cascode stage formed by transistors 34 and 35 has unity current gain, the same differential drain current will exist between transistors 34 and 35. This differential current is converted by the op amp into a voltage and is output at terminal 120. With the operation thus described, the output voltage is balanced so that it is approximately equal to $V_{DD}/2$ for zero input differential voltage.

The operation of the output stage will now be described. As stated earlier, at zero input differential voltage, both transistors 34 and 35 operate at a drain current equal to $I_{M34}$ and $I_{M35}$, respectively, each current being greater than $I_2$. The circuit is configured such that drain currents of transistors 19 and 20 are operating at a current $I_5$, which is greater than $I_{M34}$, and $I_{M35}$. This forces transistor 15 to operate at a current equal to $I_5-I_{M34}$. The drain current of transistor 15 is applied to the drain of transistor 28 and the gates of transistors 28 and 30. Transistor 29 is chosen to exactly match transistor 31 so that the drain current of transistor 29 is also equal to $I_5-I_{M34}$. The drain current of transistor 31 splits between transistors 30 and 21.

The following equations are satisfied at the drain node of transistor 20 (the "M" followed by a number denotes that the drain current of that mosfet is being referenced):

$$ABS[I_{M20}]=I_{M35}+ABS[I_{m21}]+I_{M30} \qquad (1)$$

$$ABS[I_{M21}]+I_{M30}=I_{M31}=I_5-I_{M35} \qquad (2)$$

Therefore,Ps $$ABS[I_{M20}]=I_{M35}+I_5-I_{M35} \qquad (3)$$

But the $V_{gs}$, of transistor 20 is such that $$ABS[I_{M20}]=_5, \qquad (4)$$

so we have, $$I_5=I_5 \qquad (5)$$

Therefore, the assumption of DC balance, where $I_{M34}=I_{M35}$ and $I_{M38}=I_{M39}$ has been satisfied because of the matching of $I_{M19}$ and $I_{M20}$ and the action of the current mirror formed by transistors 29 and 31. An important 2nd order effect is the errors caused by the finite output impedance of transistors 19 and 20. This could cause an imbalance in their currents if their drains are at different potentials. However, this is remedied by choosing the widths of transistors 15 and 21 such that they have equal $V_{gs}$, values so that transistors 19 and 20 have equal drain potentials.

The output stage also converts the differential current from the input stage into a single-ended drive at the gates of output transistors 150 and 160. If a differential voltage dV is applied between the input terminals, a differential current dI is generated between the drain currents of transistors 38 and 39 where dI=gm×dV, where gm represents the transconductance of the differential pair. This is illustrated by the following equations.

$$ABS[I_{M38}]=I_2/2+dI/2 \qquad (6)$$

$$ABS[I_{M39}]=I_2/2-dI/2 \qquad (7)$$

$$I_{M34}=I_4-dI/2 \qquad (8)$$

$$I_{M35} = I_4 + dI/2 \qquad (9)$$

Connected between output transistors 150 and 160 is output terminal 120, representing the single-ended output of the op amp. P-channel transistor 150 provides the output pull-up and n-channel transistor 160 provides the output pull-down. The absence of additional components in series with the source to drain path of transistors 150 and 160 permits the voltage at the output terminal 120 to be swung close to the power supply rails.

The structure of the output stage will now be discussed in more detail. Stage 36 is composed of seven p-channel transistors operation of which is similar to the current mirror described earlier with respect to FIG. 4, except that now transistors 15 and 21 receive additional currents $I_{M34}$ and $I_{M35}$ respectively. Stage 27 is composed of four n-channel transistors 28 through 31.

In stage 36, transistors 18, 14 and 17 form an input section. Constant current sink 33 passes $I_1$ which will flow in these transistors. Diode connected transistor 17 has its gate connected to its drain such that it develops a $V_T$ voltage drop that places its source potential equal to one $V_T$ greater than its gate potential. This voltage drop establishes the gate bias on transistors 18, 19 and 20 at 1 $V_T$ less than the terminal 10 positive (+) supply rail voltage, because the source of transistor 17 is connected to the gate of each of those transistors. The gate of transistor 21 is connected to the gates of transistors 14 and 17 and thereby biases those transistors at a voltage equal to 2 $V_T$ less than the positive (+) supply rail voltage. Thus, a cascode current mirror bias is established. Current $I_1$ is mirrored according to the widths of input transistor 18 and output transistors 19 and 20. Transistors 28 and 29 are diode connected thereby biasing the gates of transistors 31 and 30, respectively, at $V_T$ and 2 $V_T$ greater than the negative (−) supply rail voltage. The drain current of transistor 21 flows into the drain of transistor 31. If the current mirrors employ matched transistors, the potential of the drain of transistor 31 will be close to $V_T$ above the negative (−) supply rail voltage so as to bias the gate of transistor 160 and causing it to turn on. Likewise, the current flowing in transistor 30 flows in the drain of transistor 24. Transistor 21 biases the gate of transistor 150 at a voltage close to $V_T$ below the positive supply rail voltage. Accordingly, the quiescent output transistor current will be set up by $I_1$ flowing in current sink 33.

For signal operation, the drains of N-channel transistors 34 and 35 are coupled to the sources of transistors 15 and 21, respectively, so that the two output sections of stage 36 are driven differentially. This differential drive results in a change in the static bias on transistors 150 and 160. Any differential signal drive from transistor 34 and 35 will result in a differential current flow in transistors 150 and 160. Thus, output terminal 120 will either sink or source current depending upon the relative current conduction in transistors 34 and 35.

The op amp circuit of FIG. 5 has only one high impedance node, which is at the output. Therefore, the low internal impedance of this circuit results in a lower voltage gain and phase shift. This produces a very stable circuit configuration which is highly advantageous when driving a capacitive load.

Output transistors 150 and 160 operate in the common source mode and by themselves produce substantial voltage gain from gate to drain. Frequency compensation capacitors 47 and 48 are coupled in series between the gates of transistors 150 and 160. The juncture of capacitors 47 and 48 is returned by resistor 49 to output terminal 120. Thus, capacitor 47 and resistor 49 frequency compensate transistor 150 in that the high frequency gain is rolled off at a rate such as the typical 6 dB per octave rate. Capacitor 48 and resistor 49 provide frequency compensation for transistor 160 in a similar way. A capacitor 50 is connected directly between the gates of transistors 150 and 160 to provide stability when large source or sink currents are present, by reducing the gain when either transistor 30 or transistor 31 turns off.

FIG. 6 is a simplified diagram of the schematic of FIG. 5. The input stage includes a current source 200, a differential pair 210, current sinks 220 and a common gate level shifter 230. The differential pair 210 receives an input voltage signal IN, from input terminals 130 and 140, and is connected between current source 200 and current sink 220. The common gate level shifter 230 outputs a differential current that is indicative of the differential voltage applied at the input. The output stage includes current sources 240, six transistors, current mirror 250, and output terminal 120.

The purpose of FIG. 6 is to show, more clearly, the interrelation of transistors 15, 21, 28, 30, 150 and 160. Transistors 15 and 21 receive a currents from current sources 240 and from common gate level shift 230. The current that flows through transistor 15 drives the gates of transistors 28 and 30. Meanwhile, $I_{M35}$ flows through transistor 21 and also drives the gate of output transistor 150. The portion of $I_{M35}$ that flows through transistor 21 is combined with $I_5$ and is used to drive the gate of output transistor 160.

Current sources 240 can be implemented in such a way so as to correspond to the currents flowing through transistors 19 and 20 in FIG. 5. Current mirror 250 can be implemented so as to correspond to the arrangement of transistors 29 and 31 in FIG. 5. Of course, in the event that current sources 240 or current mirror 250 are implemented differently, slight changes may need to be made to the arrangement shown if FIG. 6.

Although the discussion above has been made with particular reference to the preferred embodiments disclosed, one of ordinary skill in the art would be enabled by this disclosure to make numerous modifications without departing from the scope and spirit of the present invention as embodied in the appended claims.

What is claimed is:

1. An operational amplifier circuit comprising:

first and second p-channel input transistors (38, 39) having commonly connected sources and having their gates respectively connected to receive first and second input signals;

a first current source (40) connected between the commonly connected sources of the first and second input transistors and a positive power supply;

a first n-channel transistor (41) having its drain connected to the drain of the first input transistor and its source connected to a negative power supply;

a second n-channel transistor (42) having its drain connected to the drain of the second input transistor and its source connected to the negative power supply;

first and second n-channel current mirror transistors (34, 35) having commonly connected gates coupled to the positive power supply via a second current source (44), the source of the first current mirror transistor (34) being coupled to the drain-drain connection between the first input transistor (38) and the first n-channel transistor (41), the source of the second current mirror transistor (35) being coupled to the drain-drain connection between the second input transistor (39) and the second n-channel transistor (42);

a third n-channel transistor (43) having its gate commonly connected to the gates of the first and second n-channel transistors (41, 42), its source connected to the negative power supply and its drain connected to the commonly-connected gates of the first and second n-channel current mirror transistors (34, 35) via a resistive element (45), the commonly-connected gates of the first, second and third n-channel transistors (41, 42, 43) being connected to the connection between the resistive element (45) and the drain of the third n-channel transistor (43);

first, second and third series-connected p-channel transistors (18, 14, 17) connected between the positive power supply and a third current source (33), the third current source being further connected to the negative power supply;

first and second p-channel current mirror transistors (19, 20) having their gates commonly connected to the gate of the first series-connected transistor (18) and to the drain-source connection between the second and third series-connected transistors (14, 17), the source of the first p-channel current mirror transistor (19) and the source of the second current mirror transistor (20) being connected to the positive power supply, the drain of the first p-channel current mirror transistor (19) being connected to the drain of the first n-channel current mirror transistor (34), the drain of the second p-channel current mirror transistor (20) being connected to the drain of the second n-channel current mirror transistor (35);

third and fourth p-channel current mirror transistors (15, 21) having their commonly connected gates connected to the commonly connected gates of the second and third series-connected transistors (14, 17), the gate of the third series-connected transistor (17) being further connected to its drain, the source of the third p-channel current mirror transistor (15) being connected to the drain of the first p-channel current mirror transistor (19), the source of the fourth p-channel current mirror transistor (21) being connected to the drain of the second p-channel current mirror transistor (20);

third and fourth n-channel current mirror transistors (28, 30) having their commonly connected gates connected to the drain of the third n-channel current mirror transistor (28), the drain of the third n-channel current mirror transistor (28) being further connected to the drain of the third p-channel current mirror transistor (15), the drain of the fourth n-channel current mirror transistor (30) being connected to a first plate of a first capacitor (50), a second plate of the first capacitor (50) being coupled to the drain of the fourth p-channel current mirror transistor (21);

fifth and sixth n-channel current mirror transistors (29, 31) having their commonly connected gates connected to the drain of the fifth n-channel current mirror transistor (29), the drain of the fifth n-channel current mirror transistor (29) being further connected to the source of the third n-channel current mirror transistor (28), the sources of the fifth and sixth n-channel current mirror transistors (29, 31) being commonly connected to the negative power supply, the drain of the sixth n-channel current mirror transistor (31) being connected to the source of the fourth n-channel current mirror transistor (30), the second plate of the first capacitor (50) being coupled to the source-drain connection between the fourth and sixth n-channel current mirror transistors (30, 31);

a p-channel pull-up transistor (150) having its source connected to the positive power supply, its gate connected to the drain-source connection between the second p-channel current mirror transistor (20) and the fourth p-channel current mirror transistor (21), and its drain connected to an output node (120);

a n-channel pull-down transistor (160) having its source connected to the negative power supply, its gate connected to the source-drain connection between the fourth and sixth n-channel current mirror transistors (30, 31), and its drain connected to the output node (120);

a second capacitor (47) having a first plate connected to the gate of the pull-up transistor (150) and to the first plate of the first capacitor (50); and having a second plate coupled to the output node (120) via a second resistive element (49); and a third capacitor (48) having a first plate connected to the gate of the pull-down transistor (160) and a second plate coupled to the output node (120) via the second resistive element (49).

* * * * *